(12) United States Patent
Dudeck et al.

(10) Patent No.: US 8,365,044 B2
(45) Date of Patent: Jan. 29, 2013

(54) MEMORY DEVICE WITH ERROR CORRECTION BASED ON AUTOMATIC LOGIC INVERSION

(75) Inventors: Dennis E. Dudeck, Hazleton, PA (US); Donald Albert Evans, Lancaster, OH (US); Hai Quang Pham, Hatfield, PA (US); Wayne E. Werner, Coopersburg, PA (US); Ronald James Wozniak, Allentown, PA (US)

(73) Assignee: Agere Systems Inc., Allentown, PA (US)

( * ) Notice: Subject to any disclaimer, the term of this patent is extended or adjusted under 35 U.S.C. 154(b) by 1401 days.

(21) Appl. No.: 11/738,827

(22) Filed: Apr. 23, 2007

(65) Prior Publication Data
US 2008/0263385 A1 Oct. 23, 2008

(51) Int. Cl.
*G11C 29/00* (2006.01)
(52) U.S. Cl. ........................................ 714/773
(58) Field of Classification Search .................. 714/773
See application file for complete search history.

(56) References Cited

U.S. PATENT DOCUMENTS

| | | | | | |
|---|---|---|---|---|---|
| 3,665,393 | A | * | 5/1972 | Brune et al. | 714/748 |
| 3,755,779 | A | * | 8/1973 | Price | 714/772 |
| 4,380,066 | A | * | 4/1983 | Spencer et al. | 714/6 |
| 4,456,993 | A | * | 6/1984 | Taniguchi et al. | 714/6 |
| 4,592,024 | A | * | 5/1986 | Sakai et al. | 365/200 |
| 4,604,749 | A | * | 8/1986 | Shinoda et al. | 714/773 |
| 4,615,030 | A | * | 9/1986 | Kumagai | 714/824 |
| 4,654,847 | A | * | 3/1987 | Dutton | 714/6 |
| 4,939,694 | A | * | 7/1990 | Eaton et al. | 365/200 |
| 5,140,597 | A | * | 8/1992 | Araki | 714/805 |
| 5,671,239 | A | * | 9/1997 | Higashitani et al. | 714/805 |
| 5,761,222 | A | * | 6/1998 | Baldi | 714/773 |
| 5,883,903 | A | * | 3/1999 | Higashitani | 714/710 |
| 5,925,138 | A | * | 7/1999 | Klein | 714/8 |
| 5,935,258 | A | * | 8/1999 | Klein | 714/8 |
| 5,974,564 | A | * | 10/1999 | Jeddeloh | 714/6.13 |
| 6,643,180 | B2 | * | 11/2003 | Ikehashi et al. | 365/185.22 |
| 6,728,158 | B2 | * | 4/2004 | Takahashi et al. | 365/225.7 |
| 6,879,509 | B2 | | 4/2005 | Evans et al. | |
| 6,886,119 | B2 | * | 4/2005 | Vancura | 714/718 |
| 6,940,754 | B2 | * | 9/2005 | Umezawa | 365/185.09 |
| 7,042,779 | B2 | | 5/2006 | Dudeck et al. | |
| 7,085,149 | B2 | | 8/2006 | Dudeck et al. | |
| 7,099,191 | B2 | * | 8/2006 | Umezawa | 365/185.09 |
| 7,177,212 | B2 | | 2/2007 | Dudeck et al. | |
| 7,181,655 | B2 | * | 2/2007 | Ditewig et al. | 714/53 |
| 7,272,757 | B2 | * | 9/2007 | Stocken | 714/718 |
| 7,650,528 | B2 | * | 1/2010 | Rahman et al. | 714/3 |
| 2004/0233715 | A1 | * | 11/2004 | Umezawa | 365/185.09 |
| 2005/0254298 | A1 | * | 11/2005 | Umezawa | 365/185.09 |
| 2006/0048031 | A1 | | 3/2006 | Aadsen et al. | |
| 2007/0217276 | A1 | * | 9/2007 | Sugisawa | 365/225.7 |

* cited by examiner

*Primary Examiner* — Joseph D Torres
(74) *Attorney, Agent, or Firm* — Ryan, Mason & Lewis, LLP

(57) ABSTRACT

A memory device comprises a memory array and error correction circuitry coupled to the memory array. The error correction circuitry is configured to identify, in a data word retrieved from the memory array, at least one bit position corresponding to a predetermined defect location in the memory array, and to generate a corrected data word by automatically inverting a logic value at the identified bit position. This automatic logic inversion approach is particularly well suited for use in correcting output data errors associated with via defects and weak bit defects in high-density ROM devices.

21 Claims, 4 Drawing Sheets

MEMORY DEVICE WITH ERROR CORRECTION BASED ON AUTOMATIC LOGIC INVERSION

FIELD OF THE INVENTION

The present invention relates generally to semiconductor memory devices, and more particularly to techniques for maintaining operability of such memory devices in the presence of defects.

BACKGROUND OF THE INVENTION

Semiconductor memory devices are subject to defects that may cause some memory cells to be read with incorrect data. For example, in high-density Read-Only-Memory (ROM) devices, a very common defect is a contact window or "via" in the conduction path of a cell transistor being open or nonconductive when it should be conductive. Another defect which is becoming much more prevalent is a "weak" bit defect, which is a bit cell with very poor drive strength. An open via or weak bit defect typically causes the associated bit line to remain at a precharge level when it should be discharged. The result is that the data read from this bit line is incorrect. Defects of the type described above are generally discovered during post-manufacture testing of integrated circuit memory devices. Defective memory devices may need to be discarded, thereby reducing the yield of the integrated circuit manufacturing process, and increasing the net manufacturing costs for the non-defective devices.

A number of techniques are known for addressing defects in memory devices. One such technique involves incorporating redundant lines, rows or blocks of cells into the device. This allows lines, rows or blocks having defective cells to be replaced with corresponding non-defective redundant elements. The replacement may be controlled, by way of example, using a volatile switch, such as a latch or flip-flop, or a non-volatile switch, such as a laser-activated fuse or electronically programmable memory element.

Another technique for addressing defects in memory devices involves utilizing an error correction code to correct data errors attributable to defects. Examples of this type of approach are disclosed in U.S. Patent Application Publication No. 2006/0048031, entitled "Built-In Self-Test for Memory Arrays Using Error Correction Coding," which is commonly assigned herewith and incorporated by reference herein.

Conventional approaches based on use of redundant elements or error correction codes may exhibit certain drawbacks. For example, such approaches may lead to undesirable increases in the size of the memory device, or in memory access and cycle times.

Accordingly, a need exists for an improved approach to dealing with defects in memory devices, particularly the common via or weak bit defects which are typical in high-density ROM devices.

SUMMARY OF THE INVENTION

The present invention in one or more illustrative embodiments provides techniques for correcting output data errors caused by defects in a memory device.

In accordance with one aspect of the invention, a memory device comprises a memory array and error correction circuitry coupled to the memory array. The error correction circuitry is configured to identify, in a data word retrieved from the memory array, at least one bit position corresponding to a predetermined defect location in the memory array, and to generate a corrected data word by automatically inverting a logic value at the identified bit position. This automatic logic inversion approach is particularly well suited for use in correcting output data errors associated with via defects and weak bit defects in high-density ROM devices.

In an illustrative embodiment, the error correction circuitry of the memory device identifies at least one bit position corresponding to a predetermined defect location in the memory array by comparing a read address used to retrieve the data word from the memory array to at least one stored defective word address identifying a word of the memory array comprising the predetermined defect location. For example, the error correction circuitry may comprise a plurality of address comparators configured to compare the read address to respective ones of a plurality of stored defective word addresses identifying respective words of the memory array each comprising one or more predetermined defect locations.

The error correction circuitry may further comprise an address bus multiplexer having inputs coupled to respective outputs of the comparators, with the address bus multiplexer being configured to select one of a plurality of defective output addresses based on a match between the read address and a corresponding one of the defective word addresses. Also included in the error correction circuitry is an output decoder which receives as input from the address bus multiplexer the selected one of the plurality of defective output addresses. The output decoder identifies, based on the selected one of the defective output addresses, at least one bit position corresponding to a predetermined defect location in the memory array, and automatically inverts a logic value at the identified bit position. A logic circuit combines an output of the output decoder with the data word retrieved from the memory array to generate the corrected data word.

The error correction circuitry may be configured to correct single-bit or multiple-bit errors in each of a plurality of data words of the memory array.

A memory device in accordance with the invention may be implemented, for example, as a stand-alone memory device, such as a packaged integrated circuit, or as an embedded memory in a processor or other device.

Advantageously, the present invention in the illustrative embodiments provides improved memory device manufacturing yield with reduced circuit complexity and area requirements relative to conventional approaches, while also avoiding significant degradation in memory access and cycle times.

DETAILED DESCRIPTION OF THE INVENTION

The invention will be illustrated herein in conjunction with exemplary semiconductor memory devices and associated error correction circuitry. It should be understood, however, that the invention is more generally applicable to any semiconductor memory device, and may be implemented using error correction circuitry other than that specifically shown in conjunction with the illustrative embodiments.

Figure 1:
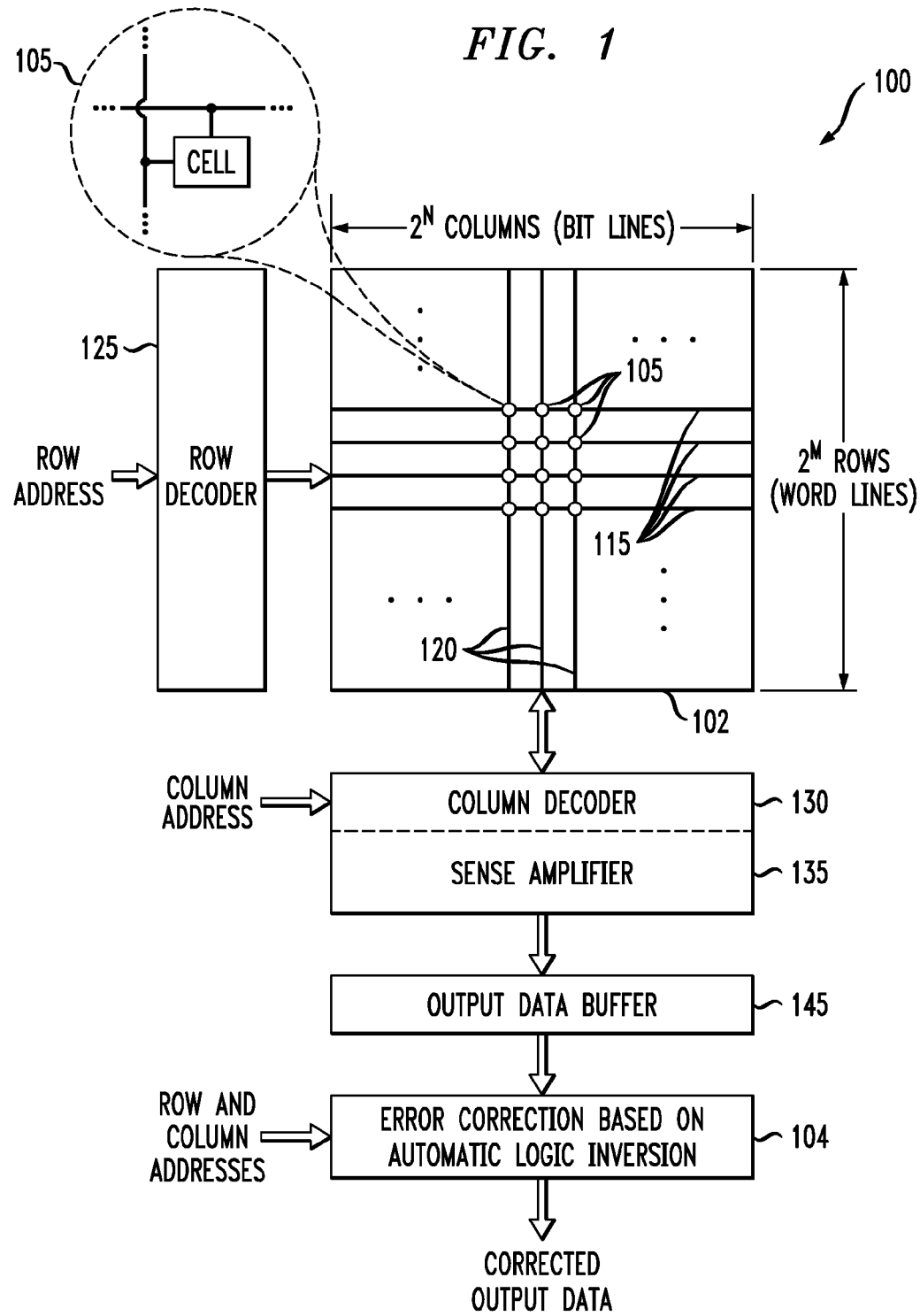
FIG. 1 shows a semiconductor memory device with error correction based on automatic logic inversion in an illustrative embodiment of the invention.

FIG. 1 shows a simplified diagram of a memory device 100 in accordance with an illustrative embodiment of the invention. The memory device 100 comprises a memory array 102 and error correction circuitry 104 coupled to the memory array. The memory array comprises a plurality of cells 105 configured to store data. Each cell 105 is coupled to a corresponding row or word line 115 and column or bit line 120. Particular ones of the cells can be activated for reading or writing of data therefrom by application of appropriate row and column addresses to respective row decoder 125 and column decoder 130. Other elements of the memory device 100 include a sense amplifier element 135 and an output data buffer 145. An input data buffer may be included in embodiments that involve writing data to the cells of the memory array. The manner in which data can be written to and read from the cells 105 of the array is well understood in the art and will not be described in detail herein.

Although memory array 102 is identified in this embodiment as comprising the cells 105 and their associated word lines and bit lines 115 and 120, the term "memory array" as used herein is intended to be broadly construed, and in other embodiments may encompass one or more associated elements such as input or output data buffers, column or row decoders, gating elements, sense amplifiers, etc. Also, it should be appreciated that the memory device is not limited to high-density ROM, but instead may be any type of memory.

Additional details regarding possible configurations for the memory array 102 and its memory cells may be found in, for example, U.S. Pat. No. 6,879,509 entitled "Read-Only Memory Architecture," U.S. Pat. No. 7,042,779 entitled "Method and Apparatus for Reducing Leakage Current in a Read Only Memory Device Using Pre-Charged Sub-Arrays," U.S. Pat. No. 7,085,149 entitled "Method and Apparatus for Reducing Leakage Current in a Read Only Memory Device Using Transistor Bias," and U.S. Pat. No. 7,177,212 entitled "Method and Apparatus for Reducing Leakage Current in a Read Only Memory Device Using Shortened Precharge Phase," all of which are commonly assigned herewith and incorporated by reference herein. The present invention, however, does not require the use of these or any other particular arrangements of memory arrays, cells or other elements.

As will be described in greater detail below, the error correction circuitry 104 in the illustrative embodiment performs single-bit or multiple-bit error correction utilizing an approach referred to herein as automatic logic inversion. Generally, in this approach, the error correction circuitry is configured to identify, in a data word retrieved from the memory array, at least one bit position corresponding to a predetermined defect location in the memory array, and to generate a corrected data word by automatically inverting a logic value at the identified bit position. Examples of specific types of error correction circuitry configured in this manner will be described below with reference to FIGS. 3 and 4.

The error correction circuitry 104 as shown in FIG. 1 receives output data from output data buffer 145. This output data may comprise, for example, one or more data words retrieved by applying an appropriate read address comprising row and column addresses to the respective row and column decoders 125 and 130. The read address comprising the row and column addresses is also applied as an input to the error correction circuitry. The error correction circuitry is configured to identify at least one bit position corresponding to a predetermined defect location in the memory array by comparing a read address used to retrieve a data word from the memory array to at least one stored defective word address identifying a word of the memory array comprising the predetermined defect location.

The memory device 100 as illustrated in FIG. 1 may include other elements in addition to or in place of those specifically shown, including one or more elements of a type commonly found in a conventional implementation of such a memory device. These and other conventional elements, being well understood by those skilled in the art, are not described in detail herein. It should also be understood that the particular arrangement of elements shown in FIG. 1 is presented by way of illustrative example only. More specifically, as previously indicated, the invention can be implemented in any type of memory device, and is not limited to any particular memory device configuration. Those skilled in the art will recognize that a wide variety of other memory device configurations may be used in implementing the invention.

As noted above, typical defects in a high-density ROM include via defects and weak bit defects. These types of defects lead to a situation in which the output data at a given bit position corresponding to one of the defects exhibits a logic value that is the opposite of the correct value. Accordingly, the error correction circuitry 104 is configured to determine if a given output data word is associated with a known defective word in the array 102, and if so automatically inverts the logic value at the bit position of a predetermined defect.

Figure 2:
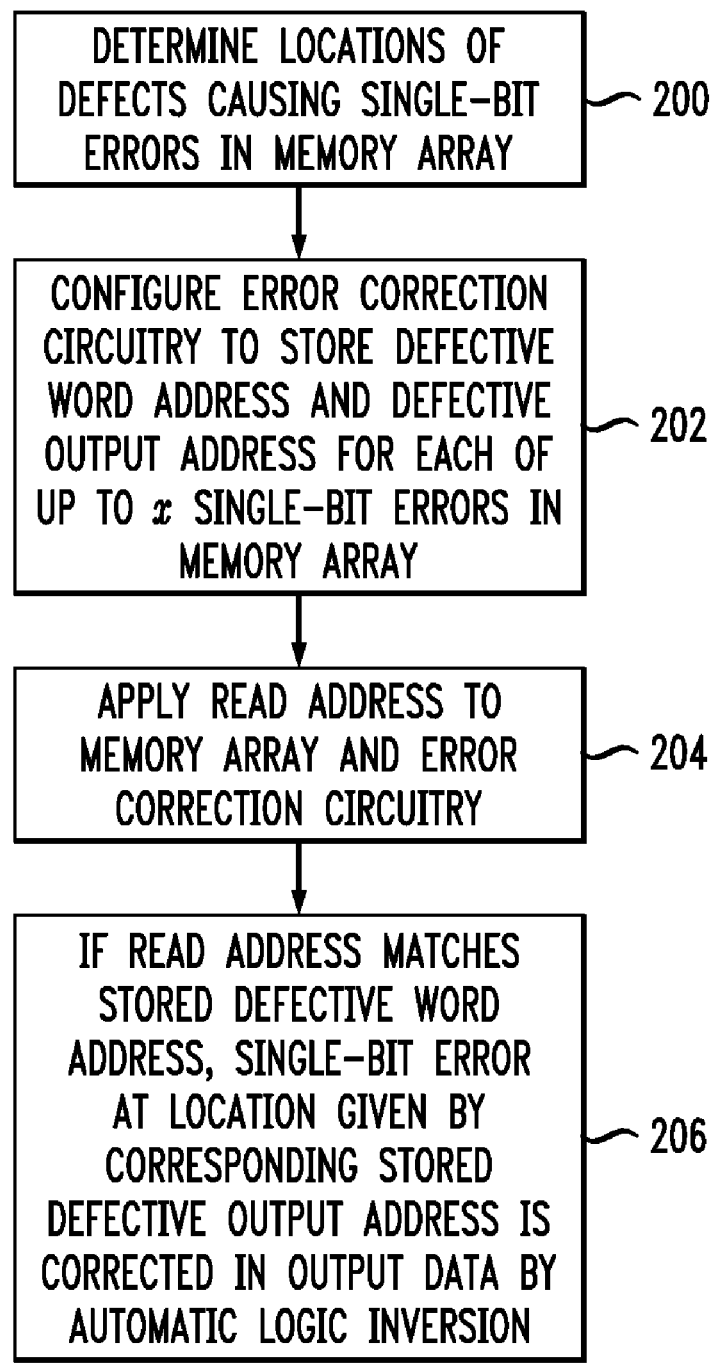
FIG. 2 is a flow diagram illustrating the operation of the memory device of FIG. 1 in correcting single-bit errors.

FIG. 2 is a flow diagram of an error correction process that is implemented in the memory device 100 of FIG. 1. This process is illustrated in the context of single-bit errors, that is, situations involving data words for which a single bit position is in error due to a defect associated with the corresponding cell. However, those skilled in the art will appreciate that the techniques are also readily applicable to correction of multiple-bit errors.

In step 200, the locations of defects causing single-bit errors in the memory array 102 are determined. These locations generally correspond to particular cells 105 within the array, and thus correspond to particular bit positions within data words that may be stored in the array. Such defects may include, as mentioned previously, via defects in which the conduction path of a cell transistor is open or nonconductive when it should be conductive or weak bit defects in which bit cells have very poor drive strength. A given such via or weak bit defect typically causes the associated bit line to remain at a precharge level when it should be discharged, resulting in incorrect output data at the corresponding bit position. The locations of such defects can be determined using well-known conventional memory testing techniques, for example, as applied during typical post-manufacture testing of an integrated circuit memory device.

In step 202, the error correction circuitry 104 stores word addresses and output addresses for each of up to x single-bit errors in the memory array, where x is an arbitrary number. The word address generally identifies the particular data word which contains the single-bit error, while the output address identifies the bit position of the error within that data word. Thus, for each single-bit error to be corrected, the error correction circuitry stores sufficient information to identify the location of the corresponding defect. The stored word addresses and output addresses are more specifically referred to herein as defective word addresses and defective output addresses, respectively.

Steps 200 and 202 will typically be applied prior to actual deployment and use of the memory device in the field. For example, these steps may be performed as part of the above-noted post-manufacture testing of an integrated circuit, before the device is sold to customers.

Steps 204 and 206 are typically performed during actual operation of the memory device, after it has been deployed in the field.

In step 204, a read address is applied to the memory array 102 and the error correction circuitry 104. This is in conjunction with the reading of at least one data word from the memory array as identified by the read address.

In step 206, the error correction circuitry 104 determines if the read address matches one of the stored defective word addresses. In the event of such a match, the single-bit error at the location given by the corresponding stored defective output address is corrected in the output data word by automatic logic inversion. That is, since the defect which led to the error was previously identified in step 200 as being of a type likely to be associated with an incorrect logic value in the output data, the incorrect logic value is automatically inverted so as to correct the error.

The particular steps of the FIG. 2 process should not be viewed as requirements of the invention. Other types and arrangements of processing steps may be used in implementing the invention. For example, as indicated above, the process can be adapted in a straightforward manner to accommodate multiple-bit errors, or to accommodate other types of errors that generally lead to predictable impacts on output data.

Figure 3:
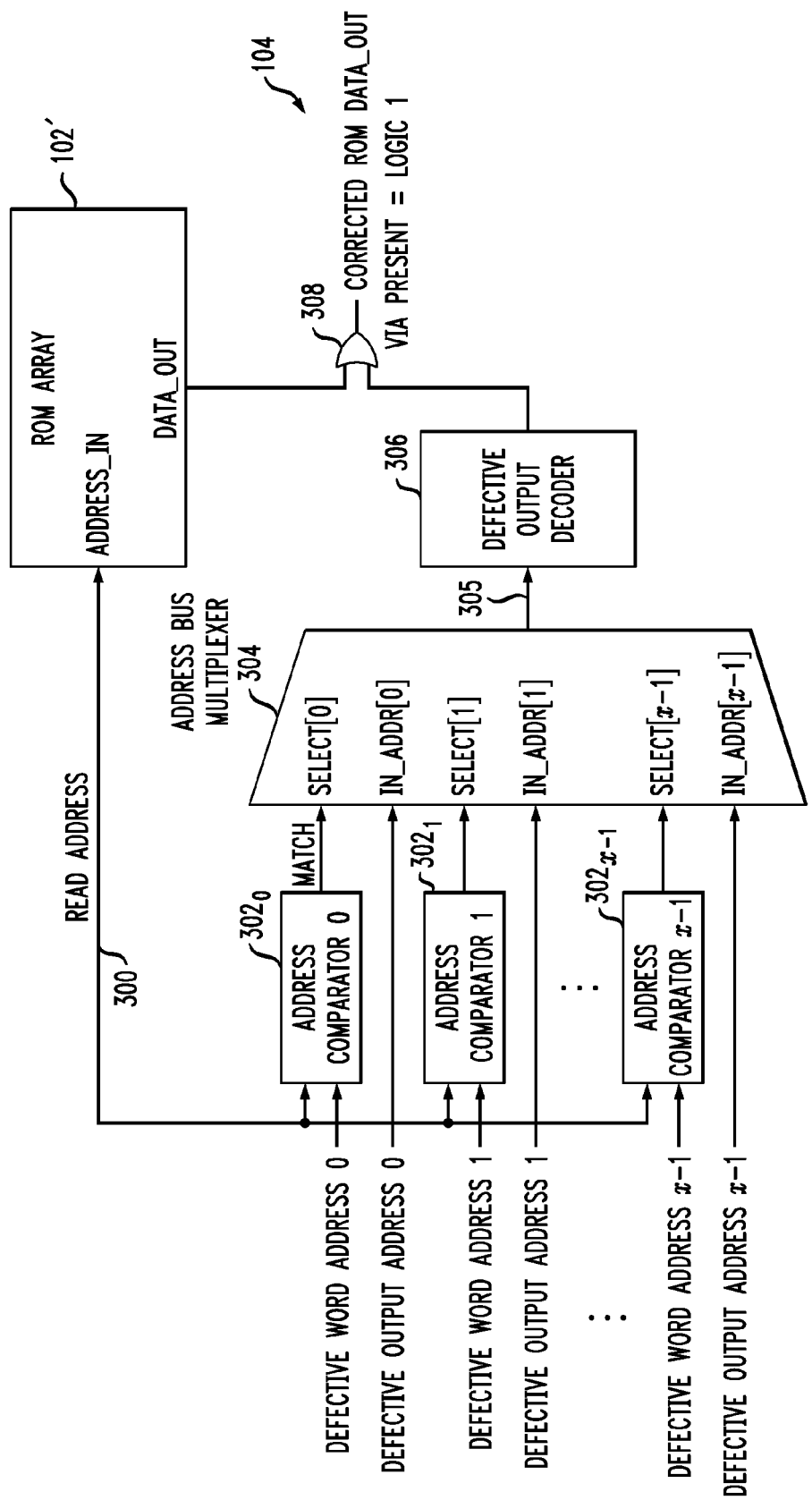
FIGS. 3 and 4 are schematic diagrams of examples of error correction circuitry that may be utilized to correct single-bit errors in the memory device of FIG. 1 using automatic logic inversion techniques.

With reference now to FIG. 3, a more detailed view of the error correction circuitry 104 is shown. The error correction circuitry in this embodiment is coupled to a memory array 102' which is assumed to comprise array 102 of FIG. 1 as well as additional supporting circuitry such as row and column decoders 125 and 130, sense amplifier element 135, and data buffer 145. It can be seen that the memory array 102' receives a read address at an input ADDRESS_IN, and generates output data at an output DATA_OUT. In the context of the FIG. 1 embodiment, the ADDRESS_IN input may correspond to the row and column decoder inputs which receive respective row and column portions of a read address, and the DATA_OUT output may correspond to the output of the output data buffer 145. The read address is applied to the memory array 102' and to the error correction circuitry over a read address signal path 300.

The error correction circuitry 104 as shown comprises x address comparators denoted $302_0, 302_1, \ldots 302_{x-1}$, where as indicated above, x is the number of single-bit errors that may be corrected in the memory array. These comparators are also identified as Address Comparator 0, Address Comparator 1, ... Address Comparator x-1. Thus, the error correction circuitry is able to correct single-bit errors in each of x different words of the memory array. Each of the address comparators receives as input the read address, over signal path 300.

The address comparators 302 are configured to compare the read address to respective ones of the stored defective word addresses. As described previously, these defective word addresses identify respective words of the memory array that include predetermined defect locations.

The error correction circuitry 104 further comprises an address bus multiplexer 304 having inputs coupled to respective match outputs of the address comparators 302. These inputs are denoted SELECT[0] through SELECT[x-1] in the figure. The address bus multiplexer also receives as inputs the previously-described defective output addresses, which identify the particular bit positions of predetermined defect locations in the respective data words identified by the respective defective word addresses. These inputs are denoted IN_ADDR[0] through IN_ADDR[x-1] in the figure. The address bus multiplexer selects a particular one of the defective output addresses applied to respective inputs IN_ADDR[0] through IN_ADDR[x-1] based on a match between the read address and a corresponding one of the defective word addresses.

The selected defective output address is supplied over signal path 305 to an output decoder 306, also referred to herein as a "defective" output decoder. This output decoder uses the selected one of the defective output addresses to identify the bit position corresponding to a predetermined defect location in the memory array 102' and to automatically invert a logic value at the identified bit position. Numerous arrangements of logic circuitry may be utilized to implement the output decoder 306, as will be readily apparent to those skilled in the art. For example, conventional decoders may be adapted in a straightforward manner to provide the described functionality associated with identification of bit positions and inversion of logic values.

The output of the defective output decoder 306 is applied to a first non-inverting input of an OR gate 308. A second non-inverting input of the OR gate 308 receives a retrieved data word from the DATA_OUT output of the memory array 102'. The OR gate combines the output of the output decoder with the data word retrieved from the memory array to generate a corrected data word, referred to in the figure as Corrected ROM DATA_OUT.

The operation of the error correction circuitry 104 as shown in FIG. 3 may be summarized as follows. During a read operation, the read address is compared against the x predetermined defective word addresses using the address comparators 302. If there is a match, then the defective output address of the corresponding match is multiplexed through address bus multiplexer 304 to the defective output decoder 306. The decoded output is then asserted by the OR gate 308. For read addresses where a match does not occur, the defective output decoder 306 asserts no outputs, allowing a defect-free output from memory array 102' to pass unmodified.

In this embodiment, the error correction circuitry 104 is configured with the assumption that a particular defect being present in a given bit position is indicated by a logic 1 value, as shown in the figure. The defect is more particularly assumed to be a via defect, and this logic assumption is defined by the statement VIA Present=Logic 1 in the figure.

Figure 4:
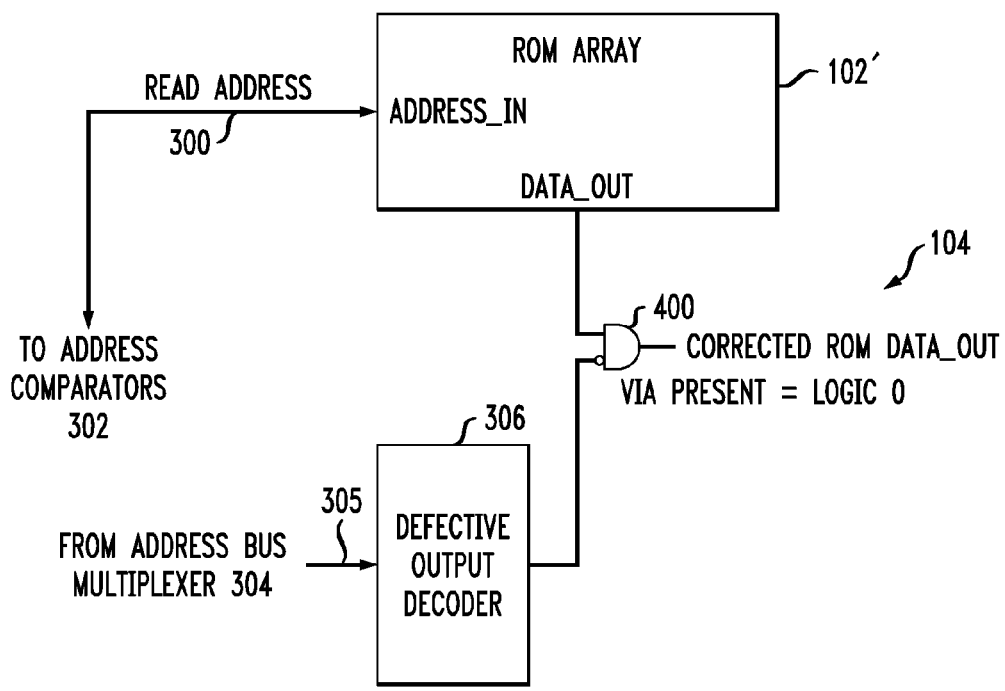

An alternative embodiment may instead assume that a defect being present in a given bit position is indicated by a logic 0 value. FIG. 4 shows such an alternative embodiment. The logic assumption in this embodiment is defined by the statement VIA Present=Logic 0, as shown in the figure. The OR gate 304 of the FIG. 3 embodiment is replaced with an AND gate 400 having an inverting input and a non-inverting input. The non-inverting input of the AND gate is coupled to the DATA_OUT output of the memory array 102'. The inverting input of the AND gate is coupled to the output of the defective output decoder 306. The AND gate combines the output of the output decoder with the data word retrieved from the memory array to generate the corrected data word given by Corrected ROM DATA_OUT.

It should be appreciated that the OR gate 308 and AND gate 400 of respective FIGS. 3 and 4 may be replaced with a wide variety of other types of logic circuits configured to combine the output of the decoder 306 with the output of the memory array 102' in order to generate a corrected data word.

The error correction circuitry 104 can be readily integrated into a given memory device design, with minimal circuit area and performance impact, and can provide substantial improvements in manufacturing yield. The amount of single-bit error correction provided in a given embodiment is scalable by the number of address comparators 302 provided and the width of the address bus multiplexer 304. The defective word addresses and corresponding defective output addresses can be stored within the memory device using any type of suitable storage mechanism, such as, for example, non-volatile registers, fuses, etc.

The illustrative embodiments thus advantageously reduce circuit complexity and area requirements relative to conventional approaches, while avoiding significant degradation in memory access and cycle times.

As mentioned previously, the error correction circuitry as described herein may be adapted in a straightforward manner to accommodate multiple-bit errors, rather than just single-bit errors as in the illustrative embodiments.

Also, although particularly well suited for use with high-density ROM, the techniques may be utilized with other memory types.

A given memory device configured in accordance with the present invention may be implemented as a stand-alone memory device, for example, a packaged integrated circuit memory device suitable for incorporation into a higher level circuit board or system. Other types of implementations are possible, such as an embedded memory device, where the memory may be, for example, embedded into a processor or other type of integrated circuit device which comprises additional circuitry coupled to the memory device. More particularly, a memory device as described herein may comprise an embedded memory of a microprocessor, central processing unit (CPU), digital signal processor (DSP), application-specific integrated circuit (ASIC), or other type of processor or integrated circuit device.

In an integrated circuit implementation of the invention, a plurality of identical die is typically formed in a repeated pattern on a surface of a wafer. Each die may include a device as described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Again, it should be emphasized that the above-described embodiments of the invention are intended to be illustrative only. For example, other embodiments can use different types and arrangements of error correction circuitry and associated logic elements for implementing the described functionality. These and numerous other alternative embodiments within the scope of the following claims will be apparent to those skilled in the art.

What is claimed is:

1. A memory device comprising:
a memory array comprising a plurality of memory cells configured to store data; and
error correction circuitry coupled to the memory array and configured to identify, in a data word retrieved from the memory array, at least one bit position corresponding to at least one predetermined defect location in the memory array, and to generate a corrected data word by automatically inverting a logic value at the at least one bit position corresponding to the predetermined defect location in the memory array;
wherein the predetermined defect location in the memory array is determined to be defective before the data word is retrieved from the memory array;
wherein the error correction circuitry is configured to identify said at least one bit position corresponding to a predetermined defect location in the memory array by:
determining at least one stored defective word address identifying a word of the memory array comprising the predetermined defect location; and
determining at least one stored output address corresponding to the at least one stored defective word address; and
wherein determining the at least one stored defective word address comprises comparing a read address used to retrieve the data word from the memory array to the at least one stored defective word address; and
wherein the at least one stored output address identifies the at least one bit position corresponding to the predetermined defect location within the word identified by the corresponding at least one stored defective word address.

2. The memory device of claim 1, wherein the error correction circuitry comprises a plurality of comparators configured to compare the read address to respective ones of a plurality of stored defective word addresses identifying respective words of the memory array each comprising one or more predetermined defect locations, each of the plurality of comparators corresponding to a different one of the plurality of stored defective word addresses.

3. The memory device of claim 2 wherein the error correction circuitry further comprises:
an address bus multiplexer having a first set of inputs coupled to respective outputs of the comparators and a second set of inputs configured to receive respective ones of a plurality of stored defective output addresses, the address bus multiplexer being configured to select one of the plurality of defective output addresses based on a match between the read address and a corresponding one of the defective word addresses;
an output decoder which receives as input from the address bus multiplexer the selected one of the plurality of defective output addresses, the output decoder being configured to identify based on the selected one of the defective output addresses said at least one bit position corresponding to a predetermined defect location in the memory array and to automatically invert a logic value at the at least one bit position corresponding to the predetermined defect location in the memory array; and
a logic circuit having an input coupled to an output of the output decoder, said logic circuit being configured to combine an output of the output decoder with the data word retrieved from the memory array to generate the corrected data word;
wherein each of the plurality of stored defective output addresses corresponds to a respective one of the plurality of stored defective word addresses and identifies at least one bit position, within the corresponding one of the plurality of stored defective word addresses, which corresponds to the predetermined defect location in the memory array.

4. The memory device of claim 3 wherein the logic circuit comprises an OR gate having a first input coupled to an output of the memory array and a second input coupled to an output of the output decoder.

5. The memory device of claim 3 wherein the logic circuit comprises an AND gate having a non-inverting input coupled to an output of the memory array and an inverting input coupled to an output of the output decoder.

6. The memory device of claim 1 wherein the error correction circuitry is configured to correct a single-bit error in each of a plurality of data words of the memory array.

7. The memory device of claim 1 wherein the error correction circuitry is configured to correct a multiple-bit error in at least one data word of the memory array.

8. The memory device of claim 1 wherein said predetermined defect comprises a via defect.

9. The memory device of claim 1 wherein said predetermined defect comprises a weak bit defect.

10. The memory device of claim 1 wherein the memory device comprises a read-only memory.

11. The memory device of claim 1 wherein the memory device comprises a stand-alone memory device.

12. The memory device of claim 1 wherein the memory device comprises an embedded memory device.

13. The memory device of claim 1 wherein the error correction circuitry operates without reliance on one or more redundant memory elements and without reliance on one or more error correction codes.

14. An integrated circuit comprising:
a memory device; and
additional circuitry coupled to the memory device;
said memory device comprising:
  a memory array having a plurality of memory cells configured to store data; and
  error correction circuitry coupled to the memory array and configured to identify, in a data word retrieved from the memory array, at least one bit position corresponding to a predetermined defect location in the memory array, and to generate a corrected data word by automatically inverting a logic value at the at least one bit position corresponding to the predetermined defect location in the memory array;
wherein the predetermined defect location in the memory array is determined to be defective before the data word is retrieved from the memory array;
wherein the error correction circuitry is configured to identify said at least one bit position corresponding to a predetermined defect location in the memory array by:
  determining at least one stored defective word address identifying a word of the memory array comprising the predetermined defect location; and
  determining at least one stored output address corresponding to the at least one stored defective word address; and
wherein determining the at least one stored defective word address comprises comparing a read address used to retrieve the data word from the memory array to the at least one stored defective word address; and
wherein the at least one stored output address identifies the at least one bit position corresponding to the predetermined defect location within the word identified by the corresponding at least one stored defective word address.

15. A method for correcting one or more likely bit errors in an output data word of a memory device, the memory device comprising a memory array having a plurality of memory cells configured to store data, the method comprising the steps of:
retrieving a data word from the memory array;
identifying at least one bit position in the retrieved data word corresponding to a predetermined defect location in the memory array; and
generating a corrected data word by automatically inverting a logic value at the at least one bit position corresponding to the predetermined defect location in the memory array;
wherein the predetermined defect location in the memory array is determined to be defective before the data word is retrieved from the memory array;
wherein the step of identifying said at least one bit position corresponding to a predetermined defect location in the memory array further comprises the steps of:
  determining at least one stored defective word address identifying a word of the memory array comprising the predetermined defect location; and
  determining at least one stored output address corresponding to the at least one stored defective word address; and
wherein determining the at least one stored defective word address comprises comparing a read address used to retrieve the data word from the memory array to the at least one stored defective word address; and
wherein the at least one stored output address identifies the at least one bit position corresponding to the predetermined defect location within the word identified by the corresponding at least one stored defective word address.

16. The method of claim 15 wherein the comparing step further comprises comparing the read address to respective ones of a plurality of stored defective word addresses identifying respective words of the memory array each comprising one or more predetermined defect locations.

17. The method of claim 16 wherein the identifying step further comprises selecting one of a plurality of defective output addresses based on a match between the read address and a corresponding one of the defective word addresses.

18. The method of claim 17 wherein the identifying step further comprises identifying based on the selected one of the defective output addresses said at least one bit position corresponding to a predetermined defect location in the memory array.

19. The method of claim 15 wherein the generating step comprises combining an output of an output decoder with the data word retrieved from the memory array to generate the corrected data word.

20. The method of claim 19 wherein the combining step further comprises:
applying an output of the memory array to a first input of an OR gate; and
applying an output of the output decoder to a second input of the OR gate.

21. The method of claim 19 wherein the combining step further comprises:
applying an output of the memory array to a non-inverting input of an AND gate; and
applying an output of the output decoder to an inverting input of the AND gate.

* * * * *